(12) United States Patent
Thomas et al.

(10) Patent No.: US 9,548,706 B2
(45) Date of Patent: Jan. 17, 2017

(54) HIGH-FREQUENCY GENERATOR

(71) Applicant: COMMISSARIAT A L'ENERGIE ATOMIQUE ET AUX ENERGIES ALTERNATIVES, Paris (FR)

(72) Inventors: Thierry Thomas, Varces Allieres et Risset (FR); Vincent Josselin, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/895,459

(22) PCT Filed: Jun. 3, 2014

(86) PCT No.: PCT/EP2014/061435
§ 371 (c)(1),
(2) Date: Dec. 2, 2015

(87) PCT Pub. No.: WO2014/195285
PCT Pub. Date: Dec. 11, 2014

(65) Prior Publication Data
US 2016/0105154 A1  Apr. 14, 2016

(30) Foreign Application Priority Data

Jun. 6, 2013 (FR) ...................... 13 55187

(51) Int. Cl.
*H03F 3/217* (2006.01)
*H03F 3/193* (2006.01)
*H03F 3/19* (2006.01)

(52) U.S. Cl.
CPC ............... *H03F 3/217* (2013.01); *H03F 3/19* (2013.01); *H03F 3/193* (2013.01); *H03F 3/2178* (2013.01);
(Continued)

(58) Field of Classification Search
CPC ...................................................... H03F 3/217
(Continued)

(56) References Cited

U.S. PATENT DOCUMENTS 3,714,597 A   1/1973 Reynolds
4,647,867 A   3/1987 Butler et al.
(Continued)

OTHER PUBLICATIONS

M. Seo et al., "A 13.56 MHz high-efficiency current mode class-D amplifier using a transmission line transformer and harmonic filter," IEEE Proceedings of the Asia-Pacific Microwave Conference 2011, Dec. 5, 2011, pp. 1262-1265, XP032152873.

*Primary Examiner* — Patricia T Nguyen
(74) *Attorney, Agent, or Firm* — Baker & Hostetler LLP

(57) ABSTRACT

The power stage at the output of a high-frequency generates operates in class D and comprises a voltage supply and a common earth, a first and a second switch linked to the common earth and periodically switched on at a high frequency F; these switches are linked to two common-mode inductors connected in a Guanella balun. Each common-mode inductor comprises two inductive lines with strong mutual coupling. The first switch is linked to the input of the first inductive line but not to the second, third and fourth lines and the second switch is linked to the input of the fourth inductive line but not to the first, second and third lines, the output of the first inductive line is linked to an output of the generator, the output of the fourth inductive line is linked to an internal resistor, the inputs of the second and third inductive lines are linked to the supply voltage source, the output of the third inductive line is linked to the output of the first inductive line and the output of the second inductive line is linked to the output of the fourth inductive line.

10 Claims, 3 Drawing Sheets

(52) U.S. Cl.
CPC ..... *H03F 2200/09* (2013.01); *H03F 2200/451* (2013.01); *H03F 2200/541* (2013.01)

(58) Field of Classification Search
USPC .............................. 330/251, 302, 195, 207 A
See application file for complete search history.

(56) References Cited

U.S. PATENT DOCUMENTS

| | | | |
|---|---|---|---|
| 5,726,603 A | 3/1998 | Chawla et al. | |
| 2003/0179044 A1 | 9/2003 | Kane | |
| 2008/0129381 A1* | 6/2008 | Inoue | H03F 1/26 330/251 |
| 2010/0033248 A1* | 2/2010 | Handa | H03F 21/00 330/207 A |
| 2011/0130163 A1* | 6/2011 | Saban | H04W 88/085 455/517 |
| 2011/0140784 A1 | 6/2011 | Tajima et al. | |
| 2012/0126888 A1* | 5/2012 | Ikriannikov | B06B 1/0261 330/69 |
| 2015/0281831 A1* | 10/2015 | Ibusuki | H03F 3/183 381/74 |

* cited by examiner

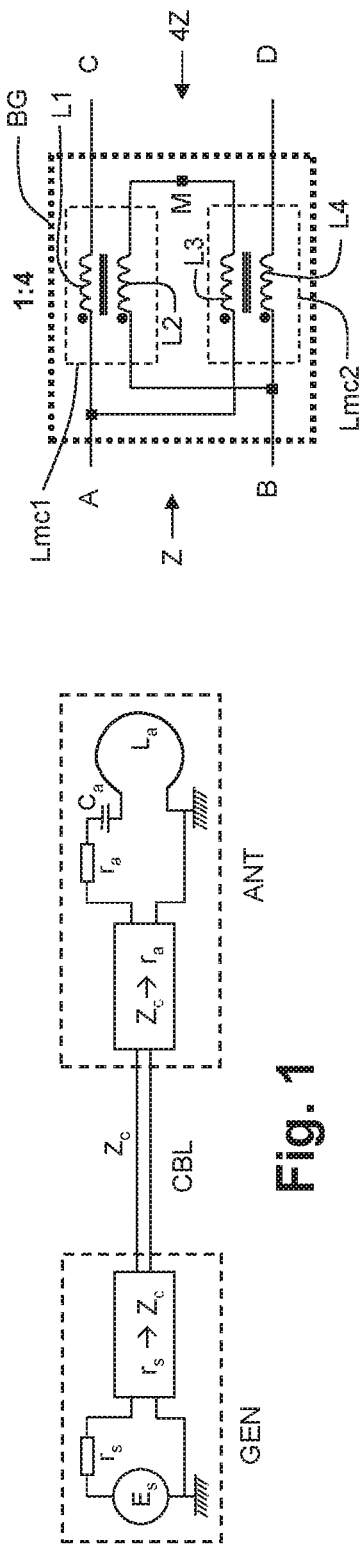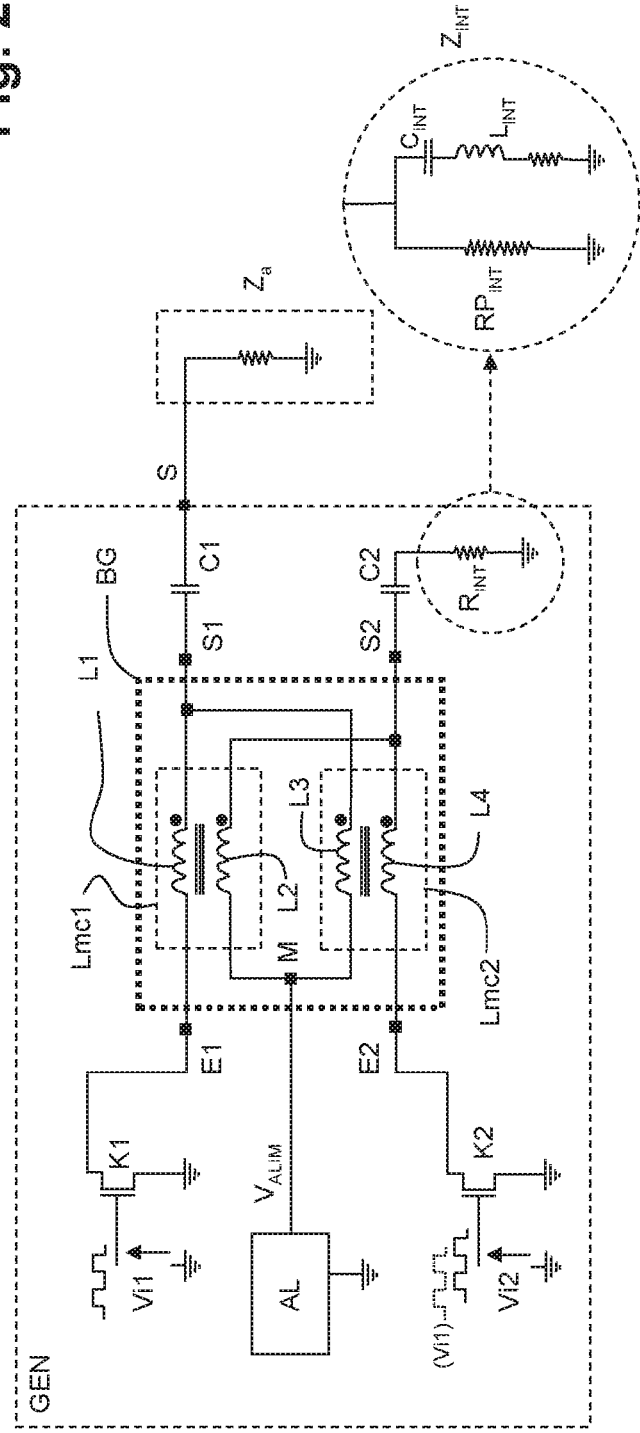

HIGH-FREQUENCY GENERATOR

CROSS-REFERENCE TO RELATED APPLICATIONS

This application is a National Stage of International patent application PCT/EP2014/061435, filed on Jun. 3, 2014, which claims priority to foreign French patent application No. FR 1355187, filed on Jun. 6, 2013, the disclosures of which are incorporated by reference in their entirety.

FIELD OF THE INVENTION

The invention relates to high-frequency generators, and more particularly to the power stage at the output of the generator.

Although the invention is applicable to a variety of contexts and producible frequencies, it will be described with respect to an application to a reader of an identification system using RFID ("Radio Frequency Identification") tags. In such an application, the reader comprises a signal generator which, connected to or associated with an antenna, makes it possible to produce radiofrequency electromagnetic signals, for example in the range of 3 to 30 MHz; these signals carry information, and are picked up by a tag known as an RFID tag which collects these signals, recognizes them as constituting an interrogation, and leads to a response itself picked up by the reader. The response may consist in a modification of the electromagnetic properties of the tag, this modification acting as a charge variation of the antenna of the reader, a variation which is recognized and decoded by the reader. The signal provided by the reader can sometimes also constitute a power source picked up by the RFID tag when the latter does not possess such itself.

A typical operating frequency for these systems is, for example, 13.56 MHz for certain current standards. The emitting powers can vary from 100 milliwatts (or even less) to 10 watts (or even more) according to the desired distance at which the detector can detect a tag and communicate with it. For these frequencies and these powers, the antenna of the reader is in general an inductive antenna comprising a conductive loop or a conductive coil, preferentially mounted in a circuit resonating at the desired frequency for the electromagnetic signals. The antenna of the RFID tag is also of this type, the interactions between the two antennas being described by inductive coupling equations. The conductive loop is associated with capacitive elements in order to be able to behave as a resonant circuit, and potentially also associated with resistive elements in order to limit the overvoltage coefficient to the resonance. The current in the conductive loop produces the electromagnetic field to which the tag is subjected if it is close enough.

The high-frequency signal produced by the generator of the reader is essentially a single-frequency periodic signal, modulated in amplitude or in phase to provide information or a command to one or more tags present in the vicinity of the reader.

BACKGROUND

To produce the output stage of the high-frequency generator, it has already been proposed to use circuits inspired by amplifiers operating in class D. These amplifiers indeed make it possible to attain much higher efficiencies than linear amplifiers operating in class A or less linear amplifiers operating in class B, AB or C. A class D amplifier operates using active components (transistors) controlled in an "all-or-nothing" manner between an "on" state and an "off" state at a frequency known as a switching frequency; in the "on" state, a current flows towards an output load, in the "off" state it is interrupted. The level of amplification is determined by the duty cycle of the conduction time at each period of the switching frequency. The input signal of the power stage is therefore a modulated signal in terms of pulse width at the switching frequency. A low-pass filtering (able to be part of the output load) eliminates the switching frequency at the output so as to conserve only the amplified input signal.

For a high-frequency generator output stage, it is possible to operate on the principle of a class D amplifier but without eliminating the switching frequency at the output, so that the output of the stage is only a power signal (modulated or not) at the switching frequency.

High-frequency generator output stages comprising two switches have therefore already been proposed, the switches being transistors operating in an "all-or-nothing" manner, activated at the desired high frequency so as to be successively and non-simultaneously conducting, linked to a power supply by inductive windings which receive currents of periodically reversed direction. These windings are coupled to other windings connected to an output load. The load receives a high-frequency alternating current.

Among the design constraints on these output stages, there is the fact that it is preferentially desirable to use transistors of the same type, rather than transistors of complementary types, as switches, for example two NPN transistors or two NMOS transistors but not an NPN transistor and a PNP transistor, or a NMOS transistor and a PMOS transistor. The reason for this is that it is desirable that the transistors have the same characteristics; now, it is difficult to obtain very similar characteristics, in terms of impedance or recovery time at the moment of switching, if the transistors are not of the same type. Additionally, the circuit diagrams are more complex if transistors of different types are used, especially for the control functions of the latter, above all if a variable supply voltage must be used, which is sometimes necessary to ensure a variable output power.

High-frequency generator output stages using transistors of the same type controlled in an "all-or-nothing" manner at the desired high frequency have already been proposed. They can use a double-wound transformer as is the case in the patent publication US2003/0179044. However, a double-wound transformer is expensive as its characteristics must imperatively be adapted to a given application and thus such a component is not readily commercially available.

Other propositions have been made based on these principles, for example in the U.S. Pat. No. 4,647,867, U.S. Pat. No. 5,726,603, U.S. Pat. No. 3,714,597, with relatively complex structures.

The technical literature also describes various high-frequency class D amplification circuits, and notably:

M. Seo, J. Jeon, I. Jung, Y. Yang "A 13.56 MHz high-efficiency current mode class-D amplifier using a transmission line transformer and harmonic filter". Proceedings of the Asia-Pacific Microwave Conference 2011;

F. H. Raab Switching transients in class-D RF power amplifiers, in HF radio systems and techniques, 7-10 Jul. 1997, conference publication No 411, IEEE, 1997;

Hermann Schreiber, 350 schémas HF de 10 kHz à 1 GHz [350 HF diagrams from 10 kHz to 1 GHz], page 267, Editions Radio 1990.

All of these diagrams use inductors known as common-mode inductors composed of two windings coiled around one and the same magnetic core. Some of the diagrams use two common-mode inductors associated in a Guanella balun (this association method will be clarified further on). They have drawbacks and notably the fact that a DC component of high value can flow in each common-mode inductor, risking the saturation of the magnetic cores. Additionally, these diagrams do not make it possible to adjust an internal impedance value of the output stage of the generator, whereas it is sometimes desirable to be able to choose the internal impedance value so as to match it to the load located downstream of the generator.

SUMMARY OF THE INVENTION

One aim of the invention is to propose a new diagram of an output stage of a high-frequency generator, which is particularly simple and effective and which makes it possible to choose the value of the internal impedance of the stage.

To this end, a high-frequency generator is proposed comprising a class D power stage comprising a voltage supply and a common earth, a first and a second switch linked to the common earth and respectively controlled by two control signals to be switched on periodically and non-simultaneously at a frequency F, and two common-mode inductors coupled in a Guanella balun, comprising for the first common-mode inductor a first and a second inductive line with strong mutual coupling, each having an input and an output, and for the second common-mode inductor a third and a fourth inductive line, each having an input and an output, characterized in that the first switch is linked to the input of the first inductive line but not of the second line and the second switch is linked to the input of the fourth inductive line but not of the third line, the output of the first inductive line is linked to the output of the power stage, the output of the fourth inductive line is linked to an internal impedance, the inputs of the second and third inductive lines are linked to the supply voltage source, the output of the third inductive line is linked to the output of the first inductive line.

The output of the second inductive line is linked to the internal impedance or potentially to another internal impedance. In practice it is preferentially linked to the output of the fourth inductive line, therefore to the same internal impedance.

From such a structure the result is that in a conduction phase of the first switch, a current can flow in the first inductive line from the output of the power stage toward the earth, inducing an opposite current in the second inductive line from the power supply toward the internal impedance, but without affecting the third and fourth inductive lines. In a conduction phase of the second switch, the opposite happens: a current can flow in the fourth inductive line from the internal impedance toward the common earth, inducing an opposite current in the third inductive line from the power supply toward the output of the power stage, but without affecting the first and second lines. The currents reverse in the load placed at the output of the power stage and in the internal impedance between the conduction phase of the first switch and the conduction phase of the second switch.

It has been noted that if the crossed structure of the two common mode inductors were inverted, the inputs and outputs of the inductive lines being purely and simply inverted, the currents in the inductive lines would not balance each other out and a DC component of high value would flow in each common-mode inductor, risking the saturation of the magnetic cores when the common-mode inductors are produced by two windings coiled around one and the same magnetic core. The structure according to the invention in which each switch is only linked to one inductive line avoids this drawback.

The switches are preferentially transistors of the same type and are identical, whether they are bipolar transistors or MOS transistors or JFET field-effect transistors.

The common-mode inductors are preferentially each formed by two juxtaposed conductors coiled in the same direction on a magnetic core. These two conductors form the two inductive lines of the common-mode inductor. Generally speaking, there is a wide selection of commercially available common-mode inductors, thus making it possible to acquire components at a reduced cost. These inductors are first and foremost characterized by an inductance value in common mode, and this value is not critical for assembly. At the frequency of 13.56 MHz, it can typically be of a few microhenries to more than 10 microhenries, giving an impedance of many hundreds of ohms at this frequency.

The common input point of the second and third inductive lines, linked to the power supply, can be linked to an earth by a decoupling capacitor in order to avoid disrupting the power supply with transient voltages or currents arising from the current commutations in the inductive lines.

Preferentially, a capacitor is placed in series between the common point of the outputs of the first and third inductive lines and the output of the power stage. Another capacitor is placed in series between the common point of the outputs of the second and fourth inductive lines and the internal impedance. These capacitors serve to effect a decoupling between the circuits downstream of the inductive lines (output of the power stage and internal impedance) and the voltage supply.

Also preferentially, a band-pass filter is placed between the output of the power stage and the load supplied with power by the generator. This filter allows the activation frequency F of the switches to pass through and eliminates the harmonics of this frequency, which harmonics result from the relatively square form of the currents produced in the inductive lines during the periodic commutation.

In one embodiment of the invention, it is envisaged that the generator comprises at least two sets of switches and common-mode inductors mounted in a Guanella balun, each set forming an elementary power stage as per the structure described previously. The outputs of the various elementary power stages are connected to a sole output of the generator. In a particular embodiment, a sole internal resistor is used for the elementary power stages. The voltage supplies of the elementary power stages are of equal or differing value. The control signals of the switches of the various sets are either identical (in which case a current twice as large for the same current in each of the switches is obtained in the load connected at the output of the generator), or different and in that case the form of the current in the load can be shaped to give it a generally more sinusoidal rather than square appearance and thus reduce the harmonics. The conduction duty cycle of the switches of a second pair of switches is then smaller than the conduction duty cycle of the first set; the conduction times of the switches of the second pair are located during the conduction times of the corresponding switches of the first pair.

BRIEF DESCRIPTION OF THE DRAWINGS

Other features and advantages of the invention will become apparent upon reading the following detailed description which makes reference to the appended drawings in which:

FIG. 1 shows a general connection diagram of a high-frequency generator with an inductive antenna applied to an RFID tag reader;

FIG. 2 shows a diagram of common-mode inductors associated in a Guanella balun;

FIG. 3 shows a diagram of the high-frequency generator according to the invention;

DETAILED DESCRIPTION

Figure 4:
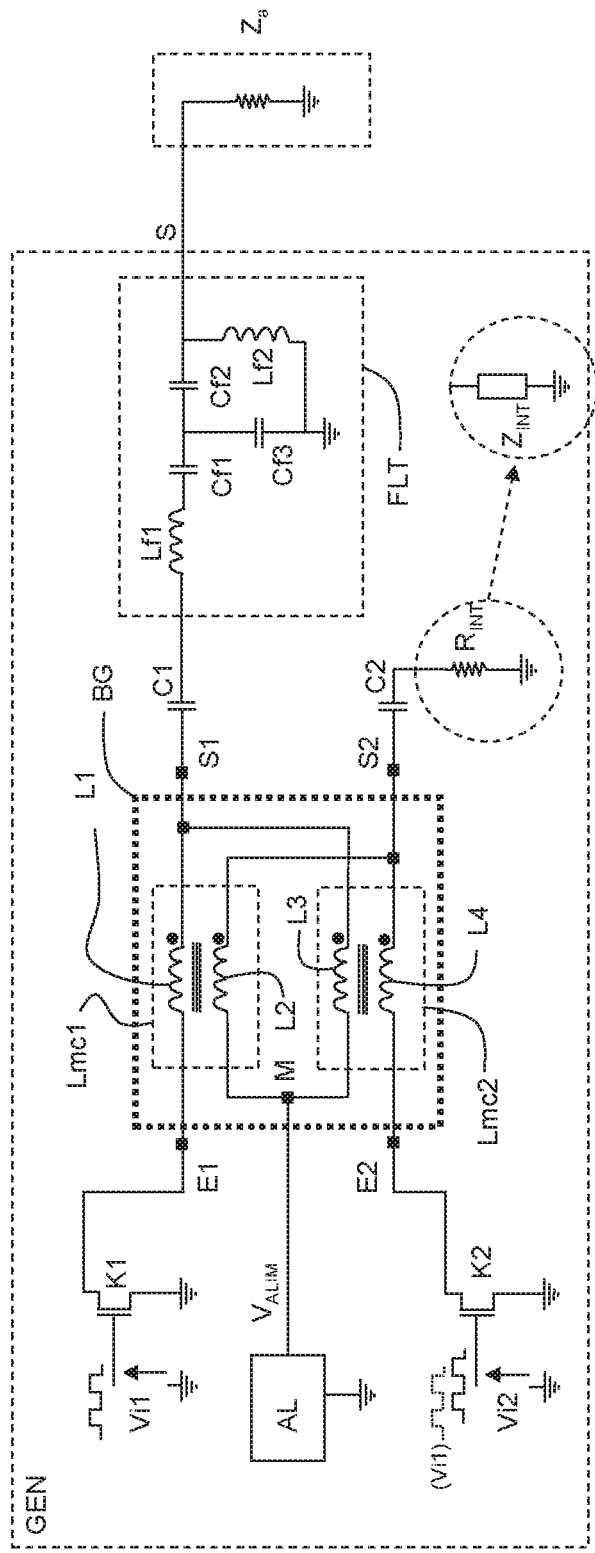
FIG. 4 shows a diagram with a band-pass filter at the output of the generator.

In FIG. 1, the basic composition of the emitting part of a base station in a high-frequency communication system is shown. In the following it is considered to be an identification system for RFID tags in which an exchange of data takes place between the base station and objects bearing tags. The invention is however not limited to this application: the invention can even be applied outside of any data exchange system, for example for a remote power supply by induction of electronic circuits without their own power supply, or to recharge a rechargeable battery of a stand-alone system via induction.

The emitting part of the base station comprises a high-frequency generator GEN and an inductive antenna ANT. The generator is symbolized by a voltage source $E_s$ supplying an alternating signal at a high frequency F, this signal being able to be modulated, for example in amplitude or in phase; this voltage source is accompanied by an impedance in series $r_s$ representing the internal impedance of the generator.

The antenna is principally an inductive coil, or a simple inductive loop, of inductance $L_a$, producing a high-frequency electromagnetic field when a high-frequency current travels through it. The antenna preferentially comprises a capacitor $C_a$ in series with the loop, of a value calculated in order to form a circuit resonating at the high frequency F. A resistor $r_a$ in series with the inductor $L_a$ and the capacitor $C_a$ symbolically represents the internal impedance of the antenna; its value is selected in order to define the desired Q-factor for the antenna ($Q_0=L_a\omega/R_a$) or to the set of the antenna+generator ($Q=L_a\omega/(r_a+r_s)$), $\omega$ being the pulse $2\pi F$. This Q-factor must not be too high if sufficient bandwidth is desired. It can be selected to be smaller than or equal to 100. The total power consumed by the generator and the antenna is $P=(r_a+r_s)I_a^2$ if $I_a$ is the current consumed by the antenna. The formulas for the Q-factor and the power P are given for the simplified case in which the generator is directly connected to the antenna. These formulas show that the internal resistance $r_s$ participates in the dimensioning of the antenna, although it is part of the generator. The part of the power P dissipated in the generator is therefore not unwanted.

The generator is linked to the antenna ANT by a cable CBL, for example a coaxial cable. The characteristic impedance of this cable is Zc. Provision is preferentially made in the generator GEN for an impedance-matching circuit for matching the impedance $r_s$ of the voltage source to the characteristic impedance $Z_C$ of the cable; provision is also made for another impedance-matching circuit in the antenna for matching the impedance $r_a$ of the antenna to the characteristic impedance $Z_C$ of the cable. The aim of this impedance matching is to optimize the transmission of power from the generator to the antenna.

FIG. 2 recalls the composition of a Guanella balun, denoted by BG in the figure: it is formed by two common-mode impedances each having two inputs and two outputs, the inputs and outputs being connected in a particular manner. A common-mode inductor is composed of two inductive lines placed side by side with strong mutual inductive coupling, ideally a coupling equal to 1; i.e. an alternating voltage at the terminals of one of the lines produces a voltage of the same value in the other, or an alternating current in one of the lines produces an opposite current of the same value in the other.

The first common-mode inductor is denoted by Lmc1; the second is denoted by Lmc2. The first common-mode inductor comprises two inductive lines L1 and L2; the second common-mode inductor comprises two inductive lines L3 and L4.

The Guanella balun comprises four terminals A, B on one side, C, D on the other. The terminal A is linked to a first end of the inductive lines L1 and L3; the terminal B is linked to a first end of the inductive lines L2 and L4; the terminal C is linked to the other end of the line L1; the terminal D is linked to the other end of the line L4; the other ends of the lines L2 and L3 are linked together and form a mid-point M which can constitute an additional terminal of the Guanella balun. Finally, if the inductive lines are formed by coils, for example by coils around ferrite cores, the direction of the windings is the same for the two coils of a common-mode inductor when going from the first end of a line to the second end, which is classically represented by a dot located on the same side of the two windings.

A property of the Guanella balun is to exhibit an impedance as seen from the ends C and D of quadruple the impedance as seen from the ends A, B and the balun shown in FIG. 2 is customarily known as a 1:4 Guanella balun when the impedance conversion from the A, B side to the C, D side is considered. It would be known as a 4:1 Guanella balun if the impedance conversion from the C, D side to the A, B side were considered.

FIG. 3 shows the principle of the high-frequency generator according to the invention, employing a Guanella balun. The load connected at the output of the generator is represented by a simple impedance $Z_a$, however this load is in practice the set of the cable CBL and the antenna ANT shown in FIG. 1, to which it may potentially be necessary to add a band-pass filter (described further on in reference to FIG. 4), an impedance-matching circuit (possibly included in the band-pass filter).

The generator comprises two identical switches K1 and K2, which are bipolar transistors or field-effect transistors and notably insulated-gate field-effect transistors. The transistors are of the same type, preferentially of the NPN type if they are bipolar transistors and N-channel transistors if they are field-effect transistors. The switches are linked on one side to a common earth and on the other each to a respective terminal of the Guanella balun. Each one is assigned to a single inductive line of a respective common-mode inductor of the Guanella balun. They are controlled by square signals Vi1 and Vi2, at the desired high frequency F and they operate in an "all-or-nothing" manner: the transistors are either off or conducting. The transistors do not conduct simultaneously. In the simplest case, they operate in phase opposition, i.e. one is conducting while the other is off and vice versa. In another case, the conduction duty cycle (conduction time over one period) is smaller than 50%: the transistors are conducting for less than half a period of the frequency F, they can simultaneously be off, but not simultaneously conducting. The modulation of the duty cycle makes it possible to affect the output power of the generator, the power being at its maximum when the duty cycle is 50%. In all cases, the voltages Vi1 and Vi2 are in phase opposition, i.e. the switching times of a switch are out of phase by 180° at frequency F in relation to the switching times of the other switch.

The Guanella balun is that shown in FIG. 2, with two common-mode inductors Lmc1 and Lmc2, each comprising two strongly coupled inductive lines, respectively L1, L2 and L3, L4, which are preferentially coils around a magnetic (ferrite) core. The mutual coupling of the two lines is ideally equal to 1. The balun is assembled as a 4:1 Guanella balun from the left to the right of FIG. 3 (thus the inverse of what is shown in FIG. 2), the impedance of the balun as seen from the input on the left being four times greater than the impedance as seen from the output on the right.

The first switch K1 is linked to a first input terminal E1 of the balun, a terminal to which a first end or the input of a sole inductive line is linked, this line being the first inductive line L1 of the first common-mode inductor Lmc1; however, the first switch is not linked to the second inductive line L2 of this first common-mode inductor nor to the inductive lines L3 and L4 of the other common-mode inductor Lmc2; the second end or output of the line L1 is linked to an output S1 of the balun.

The second switch K2 is linked to an input terminal E2 of the balun, a terminal to which a first end or the input of a sole inductive line is linked, this line being the fourth inductive line L4 of the second common-mode inductor Lmc2; however, the second switch is not linked to the third inductive line L3 belonging to this second common-mode inductor nor to the inductive lines L1 and L2 of the other common-mode inductor Lmc1; the second end or output of the line L4 is linked to an output S2 of the balun, itself linked via a decoupling capacitor C2 to an internal resistor $R_{INT}$.

The first ends or inputs of the second and third lines L2 and L3 are joined at a mid-point M. This mid-point is linked to a voltage supply AL providing a fixed or variable supply voltage $V_{ALIM}$. A variation of the supply voltage makes it possible to vary the output power of the generator.

The second end or output of the second line L2 is linked to the output S2 (also linked to the second end or output of the line L4), however, in a variant it could be linked to an internal resistor other than $R_{INT}$ and linked to the common earth as it is. The second end or output of the third line L3 is linked to the output S1 (also linked to the second end or output of the line L1).

The output S of the generator is linked to the output S1 of the balun via a decoupling capacitor in series C1. This capacitor prevents the circulation of a DC component in the load $Z_a$ supplied with power by the generator.

The output S2 of the balun is linked via a decoupling capacitor C2 to an internal resistor $R_{INT}$, the function of which is to impose a defined internal source impedance on the generator. The resistor can be adjusted in accordance with the application in order to match the impedance of the generator to the impedance of the inductive antenna, taking into account the impedance of the cable potentially present between the generator and the antenna.

The internal resistor $R_{INT}$ can potentially be replaced by a complex impedance $Z_{INT}$ as shown within a dotted circle in FIG. 3. The impedance $Z_{INT}$ is essentially composed of a series resonant circuit formed by a capacitor $C_{INT}$ in series with an inductor $L_{INT}$ and a resistor $R_{INT}$ (of the same value as in the case in which it is alone); the circuit resonates at the working frequency F of the generator. A resistor $RP_{INT}$ can be placed in parallel to the series set; its role is to set a maximum impedance value to $Z_{INT}$ outside of the resonating frequency.

This solution makes it possible to carry out a prefiltering of the signal at the output S in order to be able to connect a load $Z_a$ thereto directly, potentially in addition to the filtering carried out by a filter as will be seen with respect to FIG. 4.

Provision can be made for a decoupling capacitor, not shown, between the power supply AL output and the earth.

When applied to a communication system with RFID tags borne by mobile objects, the high-frequency generator comprises means for modifying the power supplied to the load in order to modify the level of the magnetic field produced by the antenna in accordance with the distance from the tag with which communication has been established. These means act on the level of the supply voltage $V_{ALIM}$ supplied by the voltage supply AL.

Remaining with this application, it is envisaged that the exchange of information takes place by amplitude modulation or phase modulation of the emitted frequency. To modulate the amplitude, it is possible to act on either the supply voltage $V_{ALIM}$ or on the conduction duty cycle of the switches K1 and K2. To modulate the phase, phase shifts are effected by changing the phase of the rectangular voltage waves Vi1 and Vi2 applied as control signals to the switches K1 and K2.

It will be noted that the modification of power supplied to the load by acting on the supply voltage $V_{ALIM}$ makes a great power variation range possible (a dynamic of a factor greater than 100, for example) in a very gradual manner (by steps of less than 1% of the full scale).

The circuit shown in FIG. 3 operates in the following manner: while the first switch K1 is being switched on, a current of value $I_S$ tends to flow in the inductive line L1 in the direction of the transistor K1. The strong coupling of the lines L1 and L2 produces an identical current $I_S$ in the line L2, in the opposite direction, supplied by the power supply. The switch K2 is off, the current in the line L4 is zero. The strong coupling of the lines L3 and L4 while the latter is not traversed by a current, means that no current can flow in the line L3. Consequently the current $I_S$ flowing in the inductive line L1 necessarily and entirely passes into the load Za (of the earth at the output S1): similarly, the current $I_S$ flowing in the line L2 necessarily and entirely passes into the internal resistor $R_{INT}$ (of the output S2 at the earth).

Conversely, while the second switch K2 is being switched on, a current of value Is tends to flow in the inductive line L4 in the direction of the transistor K2. The strong coupling of the lines L3 and L4 produces an identical current Is in the line L3, in the opposite direction, supplied by the power supply. The switch K1 is off, the current in the line L1 is zero. The strong coupling of the lines L2 and L1 while the latter is not traversed by a current, means that no current can flow in the line L2. Consequently the current Is flowing in the inductive line L3 necessarily and entirely passes into the load Za (of the output S1 at the earth), similarly, the current Is flowing in the line L4 necessarily and entirely passes into the internal resistor Rint (of the earth at the output S2).

Therefore flowing in the load, from the output S1 toward the earth, are alternatively a current of value $I_s$ and an opposite current $-I_s$, at the commutation frequency of the switches. This is also the case in the internal resistor $R_{INT}$.

The generator therefore supplies an alternating current $I_s$ at frequency F to the load. If the load is an inductive antenna, it produces an electromagnetic field at frequency F, potentially modulated in phase or in amplitude.

As the output current has a relatively square form due to the "all-or-nothing" commutation of the switches, It is preferred to interpose between the output S1 of the Guanella balun and the load, a band-pass filter capable of eliminating the harmonics and sub-harmonics of the frequency F. The filter can moreover be calculated to carry out, at the same time, an impedance match between the internal impedance of the generator and a reference impedance, for example the characteristic impedance of the cable linking to the antenna, if the generator is supplying an antenna with power.

FIG. 4 shows the generator with a band-pass filter incorporated in the generator, upstream of the output S and downstream of the decoupling capacitor C1. This filter FLT is here composed of a set of three capacitors in a T-formation, Cf1, Cf2, Cf3, an inductor Lf1 in series and upstream of the T-formation and an inductor Lf2 in parallel to the output of the T-formation.

It will be noted that the internal resistor $R_{INT}$ dissipates power since it tolerates an identical current to that flowing in the load. However, this resistor is not necessarily placed in the same electronic circuit as the other elements of the generator. The heat that it dissipates can therefore be distanced from the sensitive elements of the circuit. Additionally, it is a passive component which can tolerate higher temperatures than the active elements of the generator.

The assembly is tolerant of a mismatch, even a considerable one, between the impedance of the generator and that of the load. It continues to function even with a standing wave ratio (SWR) equal to 2.

As in FIG. 3, the internal resistor $R_{INT}$ can be replaced by a complex impedance $Z_{INT}$ comprising a series resonant circuit.

The common-mode inductor preferentially has a reasonably high inductance value, exhibiting an impedance greater than the impedances present in the rest of the circuit (residual impedances of the transistors in the "on" state, of the internal resistor $R_{INT}$ and of the load impedance referred back to the point S1, notably), for the high frequencies in question. For example, a common-mode inductor of 10 microhenries exhibits an impedance of 900 ohms at 13.56 MHz (standard frequency for RFID communications). This value is to be compared with the impedances of a few ohms of the internal resistor $R_{INT}$ and of the load impedance referred back to the point S1, of the same order of magnitude.

The residual mutual inductance $L_{md}$ of the common-mode inductors is preferentially as weak as possible. It is not zero if the mutual coupling coefficient of the two inductive lines is k slightly smaller than 1 and it is equal to the common-mode inductance $L_{mc}$ multiplied by $1-k^2$. It produces overvoltages on the commutations of the transistors. The coupling coefficient k is preferentially greater than 0.98 in order to minimize these overvoltages.

The filter FLT shown in FIG. 4 can have the following characteristics for a frequency of around 13.56 MHz and for an impedance match of 12 ohms to 50 ohms:

Lf1=470 nanohenries
Cf1=330 picofarads
Cf2=1.220 nanofarads
Cf3=1.220 nanofarads
Lf2=220 nanohenries Another possible set of values for an impedance match of 8 ohms to 50 ohms and while keeping the same inductance values would be: 330 pF, 1.047 nF and 1.56 nF for the capacitors Cf1, Cf2, Cf3 respectively.

The control voltages Vi1 and Vi2 applied to the switch transistors in order to make them switch from the "off" state to the "on" state are preferentially produced by a simple flip-flop D with two additional outputs, receiving a clock signal at a frequency 2F and providing two additional signals at frequency F. If a pulse-width modulation must take place, notably to ensure a transmission of information, a width modulation circuit diagram of greater complexity than a simple flip-flop D will be used.

For MOSFET transistors requiring higher gate currents than can be delivered by the flip-flops or other logic gates, specialized circuits (MOS drivers) are used; they are inserted between the logic gates and the gates of the MOS transistors.

The supply voltage $V_{ALIM}$ is preferentially a variable voltage of a few volts (for example 2 volts) to many tens of volts, (for example 30 volts), so as to adjust the emitting power within a possible range of 100 milliwatts to 15 watts.

The internal resistance $R_{INT}$ can be of around 5 ohms in this exemplary embodiment.

Figure 5:
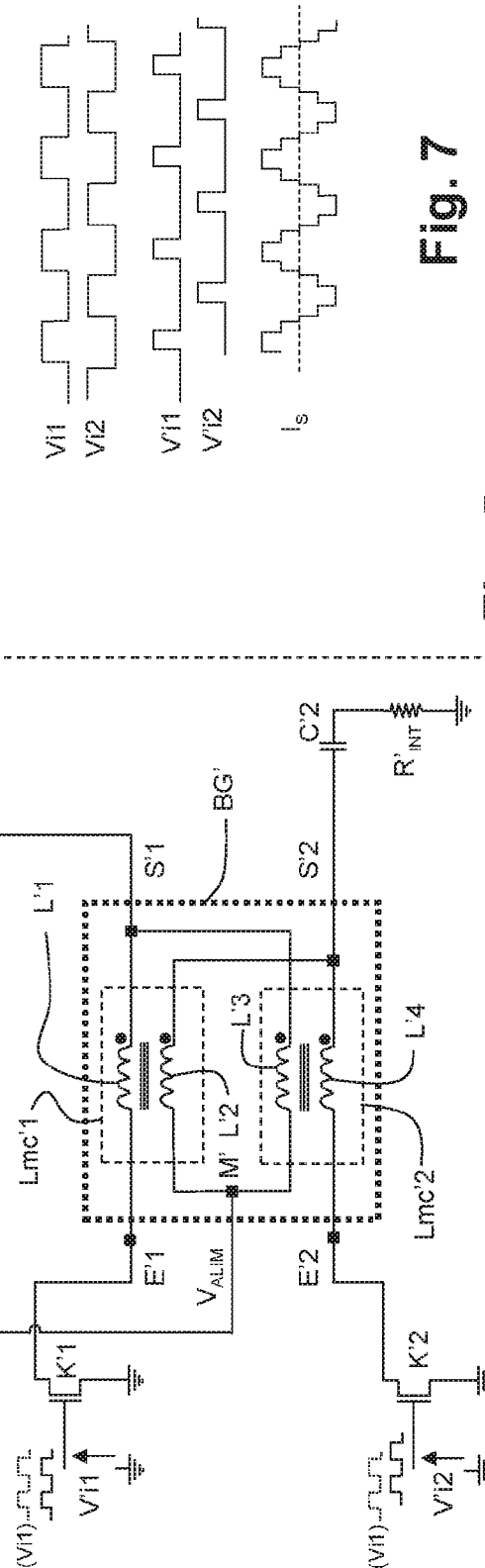
FIG. 5 shows a diagram with two elementary power stage structures in parallel.

In an alternative embodiment shown in FIG. 5, multiple Guanella baluns (two in FIG. 5) have been envisaged, along with two respective switches associated with each of the baluns.

The first balun of FIG. 5, as well as all of the circuit elements associated with this balun, are arranged exactly as in FIG. 3 and bear the same references. The second balun and the associated elements bear the same references assigned the "prime" symbol: BG', K'1, K'2, Lmc'1, Lmc'2, L'1, L'2, L'3, L'4, E'1, E'2, S'1, S'2. The output S'1 is linked to the output S1 and from there to the output S of the generator by the decoupling capacitor C1. The filter FLT is not shown in this figure, but is preferentially present.

The output S'2 can be linked to the output S2, or can be linked separately to another internal resistor $R'_{INT}$ via a decoupling capacitor C'2 different to C2.

In the alternative embodiment shown in FIG. 5, the supply voltage is shared by two sets of a structure similar to that of FIG. 3. In another embodiment, the supply voltages of the two sets are two different voltages $V_{ALIM}$ and $V'_{ALIM}$.

The control voltages V'i1 and V'i2 applied to the switches K'1 and K'2 respect the same conditions as the control voltages Vi1 and Vi2: periodicity of the conduction at the same frequency F, same conduction time for K'1 and K'2, shift by half a period between the conduction times of the two switches, and absence of simultaneous conduction of the two switches.

Figure 6:
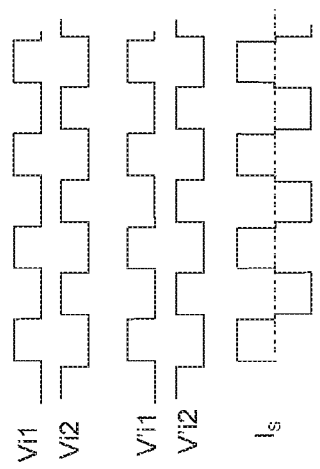
FIG. 6 shows the appearance of the output current for a first configuration of the control voltages of the transistors.

In a first example, shown in FIG. 6, the control voltages V'i1 and V'i2 are respectively identical to the voltages Vi1 and Vi2. This then results in a doubling of the current $I_s$ in the load for a given current flowing in each switch. In effect, the load experiences the sum of the currents passing through the switches K1 and K'1 then the sum of the currents passing through the switches K2 and K'2.

Figure 7:
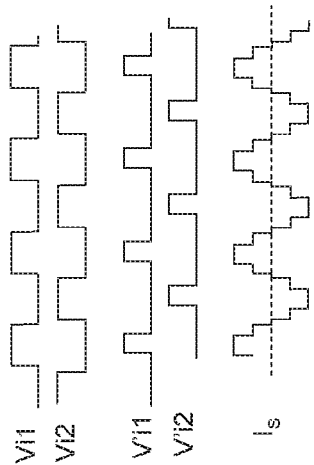
FIG. 7 shows the appearance of the output current for another configuration of the control voltages of the transistors.

In another example of operation, shown in FIG. 7, a current is made to flow in the second set for shorter durations than in the first set, for the purpose of giving a more sinusoidal form to the output current I. The switching duty cycle of the switches K'1 and K'2 is therefore weaker than that of the switches K1 and K2. The conduction of the switch K'1 takes place, however, during the conduction of the switch K1, and it is the same for K'2 and K2. In the example shown, the conduction time of the switch K'1 is located in the middle of the conduction time of the switch K1. The result is the current form $I_s$ shown in FIG. 7, having a generally more sinusoidal appearance, facilitating the subsequent filtering. The current forms $I_s$ shown in FIGS. 6 and 7 are simplified for the sake of the explanations, but in reality the circuit elements intrinsically ensure a certain amount of filtering, which means that the forms are not as square as those shown.

The invention claimed is:

1. A high-frequency generator comprising a class D power stage comprising a voltage supply and a common earth, a first pair of switches and a second switch linked to the common earth and respectively controlled by two control signals to be switched on periodically and non-simultaneously at a frequency F, and a first pair of second common-mode inductors comprising a first and second common-mode inductors coupled in a Guanella balun, comprising for the first common-mode inductor a first and a second inductive line with strong mutual coupling, each having an input and an output, and for the second common-mode inductor a third and a fourth inductive line, each having an input and an output, wherein the first switch is linked to the input of the first inductive line but not to the second, third and fourth inductive lines and the second switch is linked to the input of the fourth inductive line but not to the first, second and third lines, the output of the first inductive line is linked to an output of the power stage of the generator, the output of the fourth inductive line is linked to an internal impedance, the inputs of the second and third inductive lines are linked to the voltage supply, the output of the third inductive line is linked to the output of the first inductive line and the output of the second inductive line is linked to the internal impedance or to another internal impedance.

2. The generator of claim 1, wherein the output of the second inductive line is linked to the output of the fourth inductive line.

3. The high-frequency generator of claim 1, wherein the switches are transistors of the same type.

4. The high-frequency generator of claim 1, wherein the common-mode inductors are each formed by two juxtaposed conductors coiled in the same direction on a magnetic core.

5. The high-frequency generator of claim 1, further comprising a capacitor placed in series between the connection point of the outputs of the first and the third inductive lines and the output of the generator.

6. The high-frequency generator of claim 5, further comprising another capacitor is placed in series between the output of the fourth inductive line and the internal impedance.

7. The high-frequency generator of claim 1, further comprising a band-pass filter placed between a connection point of the outputs of the first and the third inductive lines and the output of the generator.

8. The high-frequency generator of claim 1, further comprising another pair of switches and another pair of common-mode inductors formed and associated together in the same way as the first pair of switches and the first pair of common-mode inductors, the output of the first line of the second pair of common-mode inductors being linked to the output of the first line of the first pair.

9. The high-frequency generator of claim 8, wherein the control signals of the second pair of switches are identical to the control signals of the first pair.

10. The high-frequency generator of claim 8, wherein a conduction duty cycle of the switches of the second pair is smaller than a conduction duty cycle of the first pair, conduction times of the switches of the second pair being located during conduction times of the corresponding switches of the first pair.

* * * * *